United States Patent [19]

Kozicki et al.

[11] Patent Number: 5,914,893
[45] Date of Patent: Jun. 22, 1999

[54] PROGRAMMABLE METALLIZATION CELL STRUCTURE AND METHOD OF MAKING SAME

[75] Inventors: Michael N. Kozicki; William C. West, both of Phoenix, Ariz.

[73] Assignees: Axon Technologies Corporation, Scottsdale; Arizona Board of Regents, Phoenix, both of Ariz.

[21] Appl. No.: 09/003,971

[22] Filed: Jan. 7, 1998

Related U.S. Application Data

[62] Division of application No. 08/652,706, May 30, 1996, Pat. No. 5,761,115.

[51] Int. Cl.$^6$ ................................................... G11C 13/02
[52] U.S. Cl. ........................................ 365/107; 365/153
[58] Field of Search ..................................... 365/107, 153

[56] References Cited

U.S. PATENT DOCUMENTS

| | | | |
|---|---|---|---|
| 3,017,612 | 1/1962 | Singer | 365/153 |
| 3,271,591 | 9/1966 | Ovshinsky. | |
| 3,363,239 | 1/1968 | Alexander | 365/153 |
| 3,530,441 | 9/1970 | Ovshinsky. | |
| 3,715,634 | 2/1973 | Ovshinsky. | |
| 3,765,956 | 10/1973 | Li. | |
| 3,846,767 | 11/1974 | Cohen. | |
| 3,875,566 | 4/1975 | Helbers. | |
| 3,886,577 | 5/1975 | Buckley. | |
| 3,980,505 | 9/1976 | Buckley. | |
| 3,988,720 | 10/1976 | Ovshinsky. | |
| 4,199,692 | 4/1980 | Neale. | |
| 5,177,567 | 1/1993 | Klersy et al.. | |
| 5,296,835 | 3/1994 | Nakamura. | |
| 5,500,532 | 3/1996 | Kozicki. | |

OTHER PUBLICATIONS

Diffusion–limited aggregation, *Physical Review B*, vol. 27, No. 9, May 1, 1983, pp. 5686–5697.

Pattern Selection in Dendritic Solidification, *Physical Review Letters*, vol. 53, No. 22, Nov. 26, 1984, pp. 2110–2113.

Electrochemical aspects of the generation of ramified metallic electrodeposits, *Physical Review A*, vol. 42, No. 12, Dec. 15, 1990, pp. 7355–7367.

*Electrochemical Growth of Single Metal and Alloy Clusters—Part 1. Galvanostatic Conditions*, pp. 535–539.

2D and 3D thin film formation and growth mechanisms in metal electrocrystallization—an atomistic view by in situ STM, *Surface Science* 335 (1995), pp. 32–43.

Growth rate of fractal copper electrodeposits: Potential and concentration effects, *Physical Review A*, vol. 43, No. 12, pp. 7057–7060.

(List continued on next page.)

*Primary Examiner*—Terrell W. Fears
*Attorney, Agent, or Firm*—Snell & Wilmer

[57] ABSTRACT

A programmable metallization cell ("PMC") comprises a fast ion conductor such as a chalcogenide-metal ion and a plurality of electrodes (e.g., an anode and a cathode) disposed at the surface of the fast ion conductor and spaced a set distance apart from each other. Preferably, the fast ion conductor comprises a chalcogenide with Group IB or Group IIB metals, the anode comprises silver, and the cathode comprises aluminum or other conductor. When a voltage is applied to the anode and the cathode, a non-volatile metal dendrite grows from the cathode along the surface of the fast ion conductor towards the anode. The growth rate of the dendrite is a function of the applied voltage and time. The growth of the dendrite may be stopped by removing the voltage and the dendrite may be retracted by reversing the voltage polarity at the anode and cathode. Changes in the length of the dendrite affect the resistance and capacitance of the PMC. The PMC may be incorporated into a variety of technologies such as memory devices, programmable resistor/capacitor devices, optical devices, sensors, and the like. Electrodes additional to the cathode and anode can be provided to serve as outputs or additional outputs of the devices in sensing electrical characteristics which are dependent upon the extent of the dendrite.

20 Claims, 6 Drawing Sheets

OTHER PUBLICATIONS

Electrochemically Controlled Growth and Dissolution of Silver Whiskers, *Journal of Materials Science*, (1971) pp. 252–259.

Metal photosurface deposition in As–S–Ag glasses, *Journal of Applied Physics*, vol. 46, No. 12, Dec. 1975, pp. 5312–5314.

Photo–induced structural and physico–chemical changes in amorphous chalcogenide semiconductors, *Philosophical Magazine B*, 1985, vol. 52, No. 3, pp. 347–362.

Mechanism of photosurface deposition, *Journal of Non–Crystalline Solids*, 164–166 (1993) 1231–1234.

I. Shimizu, H. Kokado and E. Inoue, Bull. Chem. Soc. Jap., 46 (12), 3662–3665 (1973).

Y. Hirose and H. Hirose, J. Appl. Phys., 47 (6), 2767–2772 (1976).

Y. Hirose and H. Hirose and M. Morisue, Phys. Stat. sol. (a), 61, K187–K190 (1980).

T. Kawaguchi, S. Maruno and K. Tanaka, J. Non–Crystl. Sol., 164–166, 1231–1234 (1993).

PROGRAMMABLE METALLIZATION CELL STRUCTURE AND METHOD OF MAKING SAME

RELATED U.S. APPLICATION DATA

This application is a divisional of U.S. Ser. No. 08/652,706 filed on May 30, 1996 U.S. Pat. No. 5,761,115.

TECHNICAL FIELD

The present invention relates, generally, to a programmable metallization cell comprising a fast ion conductor, a plurality of electrodes and a voltage-controlled metal structure or dendrite formed at the surface of the fast ion conductor between the electrodes, and more particularly, to devices such as electronic memory, programmable resistors and capacitors, integrated optical devices, and sensors utilizing the programmable metallization cell.

BACKGROUND ART AND TECHNICAL PROBLEMS

Memory Devices

Memory devices are used in electronic systems and computers to store information in the form of binary data. These memory devices may be characterized into various types, each type having associated with it various advantages and disadvantages.

For example, random access memory ("RAM") which may be found in personal computers is volatile semiconductor memory; in other words, the stored data is lost if the power source is disconnected or removed. Dynamic RAM ("DRAM") is particularly volatile in that it must be "refreshed" (i.e. recharged) every few microseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off.

CD-ROM is an example of non-volatile memory. CD-ROM is large enough to contain lengthy audio and video segments; however, information can only be read from and not written to this memory. Thus, once a CD-ROM is programmed during manufacture, it cannot be reprogrammed with new information.

Other storage devices such as magnetic storage devices (i.e., floppy disks, hard disks and magnetic tape) as well as other systems, such as optical disks, are non-volatile, have extremely high capacity, and can be rewritten many times. Unfortunately, these memory devices are physically large, are shock/vibration-sensitive, require expensive mechanical drives as well as consume relatively large amounts of power. These negative aspects make these memory devices non-ideal for low power portable applications such as lap-top and palm-top computers and personal digital assistants ("PDAs").

Due to the rapidly growing numbers of compact, low-power portable computer systems in which stored information changes regularly, read/write semiconductor memories have become widespread. Furthermore, because these portable systems require data storage when the power is turned off, a non-volatile storage device is required. The simplest programmable semiconductor non-volatile memory devices in these computers are programmable read-only memory ("PROM"). The most basic PROM uses an array of fusible links; once programmed, a PROM cannot be reprogrammed. This is an example of a write-once read-many ("WORM") memory. The erasable PROM ("EPROM") is alterable, but each rewrite must be preceded by an erase step involving exposure to ultra violet light. The electrically erasable PROM ("EEPROM" or "E$^2$PROM") is perhaps the most ideal of conventional non-volatile semiconductor memory, as it can be written to many times. Flash memories, another type of EEPROM, have higher capacity than the low density, traditional EEPROMs but lack their endurance. One major problem with EEPROMs is that they are inherently complex. The floating gate storage elements that are used in these memory devices are difficult to manufacture and consume a relatively large amount of semiconductor real estate. Furthermore, the circuit design must withstand the high voltages necessary to program the device. This means that an EEPROM's cost per bit of memory capacity is extremely high compared with other means of data storage. Another disadvantage of EEPROMs is that although they can retain data without having the power source connected, they require relatively large amounts of power to program. This power drain can be considerable in a compact portable system powered by a battery.

Recently, a great amount of attention has been given to an alternative non-volatile memory technology based on ferroelectric materials. Unfortunately, there is still a great number of problems associated with this data storage approach that have prevented the widespread application of ferroelectric materials, the various problems including non-ideal storage characteristics and extreme difficulties in manufacturing.

Accordingly, in view of the various problems associated with conventional data storage devices described above, it is highly desirable to have a read/write memory technology and device which is inherently simple and inexpensive to produce. Furthermore, this memory technology should meet the requirements of the new generation of portable computer devices by operating under a low voltage while providing high storage density, non-volatility, and a low manufacturing cost.

Programmable Passive and Active Components

Electronic circuits may comprise literally millions of component parts. These component parts generally fall into two distinct categories, namely, passive components and active components. Passive components, such as resistors and capacitors, have electrical values associated with them which are relatively constant. On the other hand, the electrical values of active components, such as transistors, are designed to change when a voltage or current is applied to control electrodes.

Because of the extensive use of these two types of components, it is highly desirable to have a low-cost device which may perform both the functions of a passive component and an active component. For example, it would be highly desirable to have a device that acts as an active component which responds to an applied signal by altering its resistance and capacitance and yet, in an alternate embodiment, the same device acts as a passive component which can be pre-programmed (i.e., the change is "remembered" by the device after programming is complete). Such a device would be able to be implemented in many diverse applications from tuned circuits in communications equipment to volume controls in audio systems.

Optical Devices

Recently, there has been an enormous demand for various optical devices such as display devices for lap-top computers, high definition television ("HDTV"), spatial light modulators, and the like. It would be highly desirable to have a low cost, highly manufacturable device that may be utilized in such optical devices as, for example, a shutter to block the passage of light through an optical cell or as a mirror which may deflect a scanned incident beam on or off a screen or other target.

Sensors

The measurement of exposure to ultraviolet radiation and other forms of radiation is very important as radiation is believed, for example, to promote skin cancer and other damaging effects to an individual.

Accordingly, it is desirable to have a highly manufacturable device that may be used in low-cost, wavelength sensors or sensor arrays for short wavelength radiation such as ultraviolet radiation ($10^{-7}$–$10^{-9}$ meters), x-rays ($10^{-9}$–$10^{-11}$), and gamma rays ($10^{-11}$–$10^{-14}$).

Conclusion

Because of the widespread use of devices such as memory devices, programmable resistor and capacitor devices, electro-optical devices, and sensors, it is very desirable to have a low cost, easy to manufacture device that may be implemented in all of these various applications, among others.

SUMMARY OF THE INVENTION

In accordance with an exemplary embodiment of the present invention, a programmable metallization cell ("PMC") comprises a fast ion conductor such as a chalcogenide-metal ion and at least two electrodes (e.g., an anode and a cathode) comprising an electrically conducting material and disposed at the surface of the fast ion conductor a set distance apart from each other. Chalcogenide materials as referred to herein include all those compounds involving sulfur, selenium and/or tellurium. In a preferred embodiment, the fast ion conductor comprises a chalcogenide and Group I or Group II metals (most preferably, arsenic trisulphide-silver), the anode comprises silver and the cathode comprises aluminum or other conducting material. When a voltage is applied to the anode and the cathode, a non-volatile metal dendrite rapidly grows from the cathode along the surface of the fast ion conductor towards the anode. The growth rate of the dendrite is a function of the applied voltage and time; the growth of the dendrite may be stopped by removing the voltage or the dendrite may be retracted back towards the cathode by reversing the voltage polarity at the anode and cathode. Changes in the length of the dendrite affect the resistance and capacitance of the PMC.

In accordance with one aspect of the present invention, a PMC is utilized as a memory storage device. More particularly, by applying a constant or pulsed bias to the cathode and anode over a period of time, a dendrite of a certain length is produced. Associated with this dendrite length are measurable electrical parameters such as resistance and capacitance. In a preferred embodiment, both analog or digital values may be stored in the device.

In accordance with another aspect of the present invention, a PMC is employed as a programmable resistor/capacitor device wherein a specific resistance or capacitance value is programmed by applying a DC voltage for an appropriate period of time.

In accordance with yet another aspect of the present invention, an electro-optical device comprises a PMC having electrodes of broad width. When a large voltage is applied to the electrodes, a dendrite "sheet" is produced that acts as a shutter to block the passage of light through an optical cell or as a mirror for deflecting a scanned incident beam on or off a screen or other target.

In accordance with still a further aspect of the present invention, a PMC is utilized as a short wavelength radiation sensor. Because the growth and dissolution rate of the metal dendrite is sensitive to certain wavelengths, the difference in the growth rate of the dendrite can than be related to the intensity of the incident radiation.

BRIEF DESCRIPTION OF THE DRAWING FIGURES

The present invention will hereinafter be described in conjunction with the appended drawing figures, wherein.

DETAILED DESCRIPTION OF PREFERRED EXEMPLARY EMBODIMENTS

I. Programmable Metallization Cell

Figure 1A:
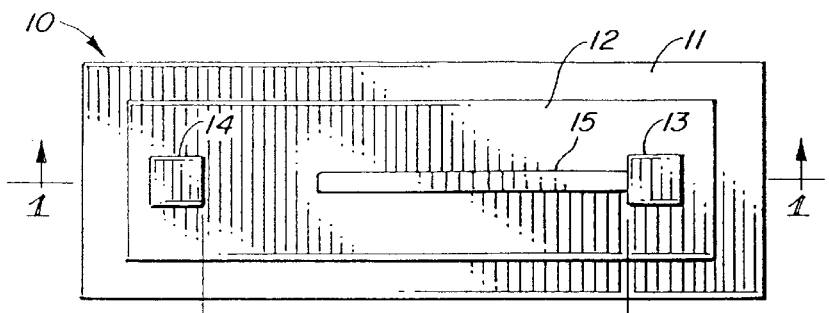
FIG. 1A is a plan view of a programmable metallization cell in a lateral configuration in accordance with one embodiment of the present invention.
Figure 1B:
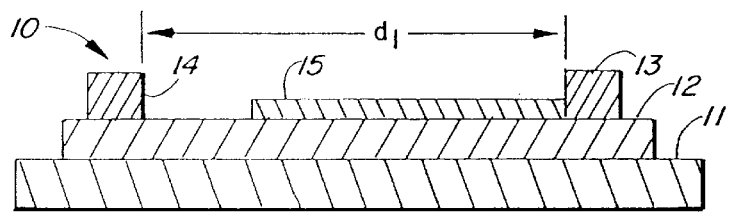
FIG. 1B is a cross-sectional view of FIG. 1A taken from line 1—1.

Referring now to FIGS. 1A and 1B, an exemplary programmable metallization cell ("PMC") 10 in a lateral or horizontal configuration is shown in accordance with one embodiment of the present invention. FIG. 1A is a plan view of PMC 10 and FIG. 1B is a cross-sectional view of PMC 10 taken from line 1—1 of FIG. 1A. PMC 10 comprises a fast ion conductor 12 and a plurality of electrodes 13 and 14 (e.g., cathode 13 and anode 14) disposed at the surface of fast ion conductor 12. Optionally, a supporting substrate 11 may be provided at the base of fast ion conductor 12, above electrodes 13 and 14 (not shown), or both, to give added strength and rigidity to device 10. Substrate 11 may appropriately comprise, for example, plastic, glass, or semiconductor material.

With continued reference to FIGS. 1A and 1B, fast ion conductor 12 comprises a solid electrolyte, a metal ion-containing glass, a metal ion-containing amorphous semiconductor, a chalcogenide-metal ion, or the like. In the broadest sense, a chalcogenide material in accordance with the present invention includes any compound containing sulfur, selenium and/or tellurium, whether ternary, quaternary or higher compounds. In a preferred embodiment, fast ion conductor 12 comprises a chalcogenide-metal ion composition, the chalcogenide material is selected from the group consisting of arsenic, germanium, selenium, tellurium, bismuth, nickel, sulfur, polonium and zinc (preferably, arsenic sulphide, germanium sulfide, or germanium selenide) and the metal comprises various Group I or Group II metals (preferably, silver, copper, zinc or a combination thereof). The chalcogenide-metal ion composition may be obtained by photodissolution, by depositing from a source comprising the chalcogenide and metal, or by other methods known in the art.

With continued reference to FIGS. 1A and 1B, in a most preferred embodiment, fast ion conductor 12 comprises arsenic trisulphide-silver ("$As_2S_3$—Ag"). The silver is introduced into the $As_2S_3$ by illuminating a thin silver film and the $As_2S_3$ layer with light of wavelength less than 500 nanometers. If sufficient silver is present, the process results in the formation of a ternary compound which is stoichiometrically similar to the mineral smithite ($AgAsS_2$), a stable amorphous material. Preferably, sufficient silver is deposited on the chalcogenide surface to form the equilibrium phase throughout the chalcogenide layer. While it is possible for PMC 10 to operate without fast ion conductor 12 being in the equilibrium phase, the operation of PMC 10 requires considerably higher voltage.

With continued reference to FIGS. 1A and 1B, electrodes 13 and 14 are suitably arranged apart from each other at the surface of fast ion conductor 12, forming a distance d1 in the range of preferably hundreds of microns to hundredths of microns. Electrodes 13 and 14 may comprise any electrically conducting material that will produce an electric field for the rapid transport of metal ions in fast ion conductor 12. When a voltage is applied to electrodes 13 and 14, a metal dendrite 15 grows from electrode 13 (i.e. cathode), the electrode connected to the negative pole of the power supply. Dendrite 15 grows by precipitation from the solid solution of cations (e.g. silver cations) on cathode 13 created by a high local electric field. Dendrite 15 may be allowed to grow across the surface of fast ion conductor 12 until it meets opposing electrode 14, thereby closing the gap and completing the electrical circuit. Alternatively, dendrite 15 may be halted before it reaches anode 14 by removing the voltage source or by placing an insulating physical barrier before the anode. As long as dendrite 15 does not touch opposite electrode 14, its growth can be easily stopped and retracted by reversing the voltage at electrodes 13 and 14. Changes in the length of dendrite 15 affect the resistance and capacitance of PMC 10; these changes may then be easily detected using simple circuitry known in the art. Another important characteristic of dendrite 15 is its non-volatility; metal dendrite 15 remains intact when the voltage is removed from electrodes 13 and 14.

With continued reference to FIGS. 1A and 1B, in a preferred embodiment where fast ion conductor 12 comprises $As_2S_3$—Ag, anode 14 comprises silver such as a solid silver layer or a silver-aluminum bilayer; this allows for rapid dendrite growth to occur at a relatively low electric field as anode 14 acts as a sacrificial electrode. Cathode 13 may be a solid silver layer, an aluminum layer, or a silver-aluminum bilayer, and in some configurations aluminum is the preferred material. If electrodes 13 and 14 comprise silver (e.g. pure silver or an aluminum-silver bilayer), dendrite 15 will grow from the electrode that is connected to the negative side of the power supply; when the voltage is reversed, the previous dendrite is dissolved or retracted and a new dendrite grows from the opposite electrode. Alternatively, if cathode 13 comprises aluminum and anode 14 comprises pure silver or a silver-aluminum bilayer, dendrite 15 will only grow from cathode 13; when the voltage polarity is reversed, dendrite 15 will retract towards cathode 13 but little or no dendrite growth will occur from opposite electrode 14. If anode 14 or both cathode 13 and anode 14 comprise aluminum or another non-dissolving metal (e.g., gold), growth of dendrite 15 becomes extremely slow and requires a high applied voltage. With continued reference to FIGS. 1A and 1B, the growth rate of dendrite 15 is a function of the applied voltage and time. Low voltages result in relatively slow growth whereas higher voltages produce extremely rapid growth. In small geometry devices (i.e., a few microns in width), voltages in the range of approximately 0.5 volts to 1.0 volts produce single dendrite structures with growth rates greater than $10^{-3}$ m/s while voltages in excess of 10 volts can produce a "sheet" of dendrite 15 between electrodes 13 and 14, rather than a single dendrite.

With continued reference to FIGS. 1A and 1B, a soft, polymeric coating (not shown) such as polyimide or novolac may be disposed over fast ion conductor 12 and electrodes 13 and 14 for protecting PMC 10 from moisture or physical damage while still allowing growth of dendrite 15.

Figure 2:
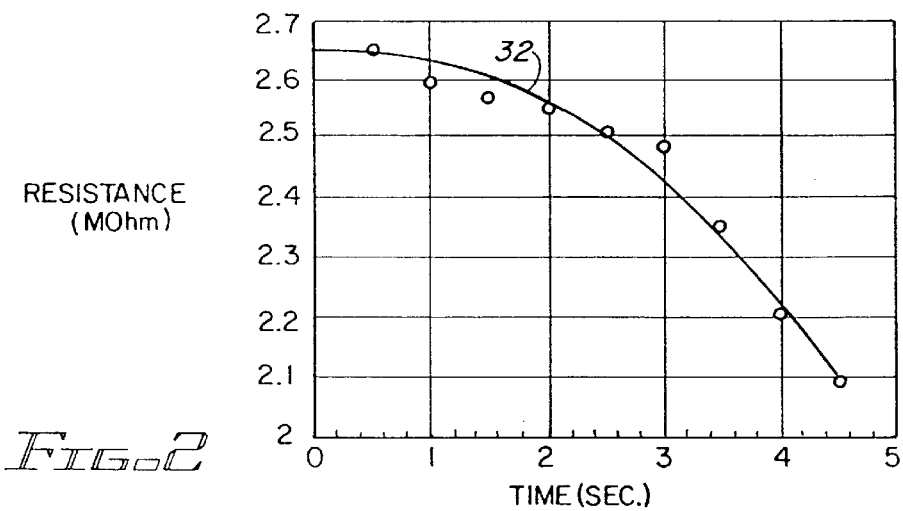
FIG. 2 is a graphic representation showing the relationship between resistance and time in an exemplary programmable metallization cell.
Figure 3:
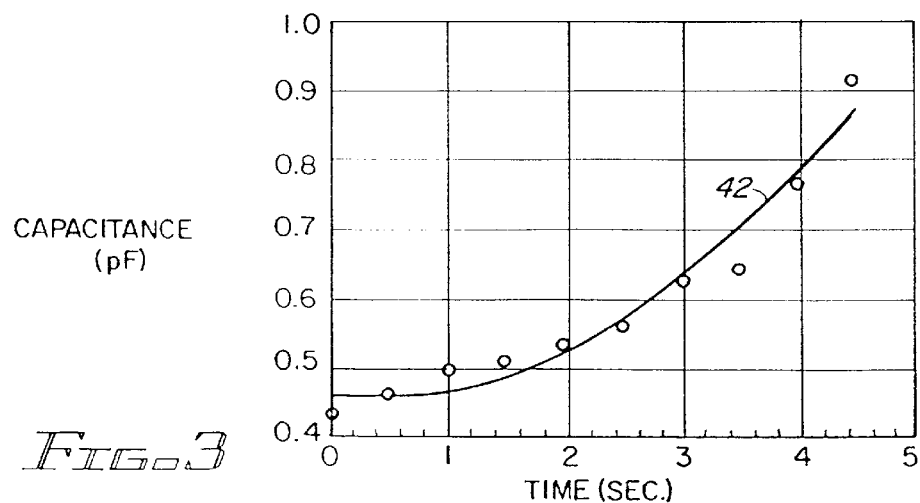
FIG. 3 is a graphic representation showing the relationship between capacitance and time in an exemplary configuration of a programmable metallization cell.

Referring now to FIGS. 2 and 3, graphic representations show the relationship in a PMC between resistance and time and capacitance and time, respectively. The PMC used to obtain these results was a relatively large device (i.e. approximately 12 microns from electrode to electrode); nevertheless, these results provide a fair overview of the general electrical characteristics of the PMC.

With specific reference to FIG. 2, a curve 32 represents the relationship between the resistance and time of the PMC. Before any voltage is applied to the electrodes of the PMC, the resistance of the PMC is approximately 2.65 megohms. When a small 0.7 volt bias is applied to the electrodes as a series of 0.5 second pulses, the resistance of the PMC demonstrates an inversely proportional relationship to the length of time the voltage is applied to the electrodes. For example, the resistance value after 4.5 seconds of applied voltage has decreased approximately 550K ohms to approximately 2.1 megohms. Greater changes in the resistance value are achieved when a smaller PMC device or larger voltages are used.

With reference now to FIG. 3, a curve 42 shows the relationship between the capacitance of the PMC versus time. At approximately 0.5 seconds of an applied 0.7 volt bias, there is approximately 0.45 picofarads of capacitance for the PMC device. When 0.7 volts is applied to the electrodes as a series of 0.5 second pulses, the capacitance of the PMC then rapidly increases to approximately 0.9 picofarads after 4.5 seconds. The capacitance increase is even greater if a smaller PMC device is used or larger voltages applied.

Figure 4A:
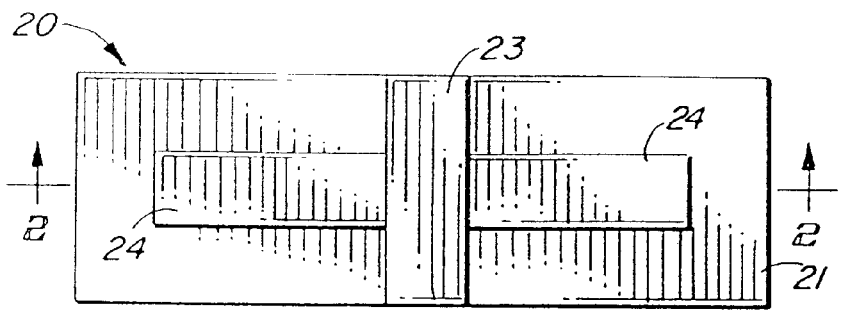
FIG. 4A is a plan view of a programmable metallization cell in a vertical configuration in accordance with another embodiment of the present invention.
Figure 4B:
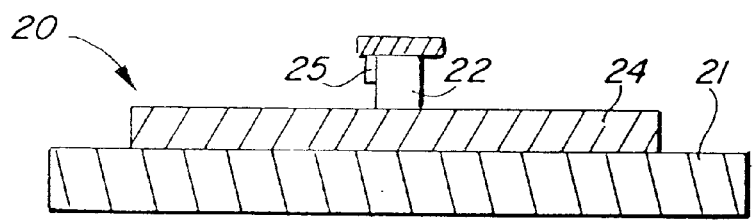
FIG. 4B is a cross-sectional view of FIG. 4A taken from line 2—2.

With reference now to FIGS. 4A and 4B, a vertically configured PMC 20 is illustrated in accordance with another embodiment of the present invention. While the lateral configuration of FIGS. 1A and 1B is easier to fabricate and has a lower associated manufacturing cost, the vertical configuration provides the advantages of a much more compact device. FIG. 4A is a plan view of PMC 20 in the vertical configuration and FIG. 4B is a cross-sectional view of PMC 20 taken from line 2—2 of FIG. 4A.

With continued reference to FIGS. 4A and 4B, an electrode 23 (e.g., a cathode) and an electrode 24 (e.g., an anode) are positioned apart from each other in parallel planes. A fast ion conductor 22 is disposed or sandwiched between electrodes 23 and 24. When a voltage is applied to cathode 23, a dendrite 25 grows from cathode 23 along the surface of fast ion conductor 22 towards anode 24. In a preferred embodiment, a supporting substrate 21 is provided adjacent electrode 24 or 23 to support and give rigidity to PMC 20.

II. Metal Dendrite Memory

As described above, a PMC may be implemented in various different technologies. One such application is in memory devices.

Figure 5A:
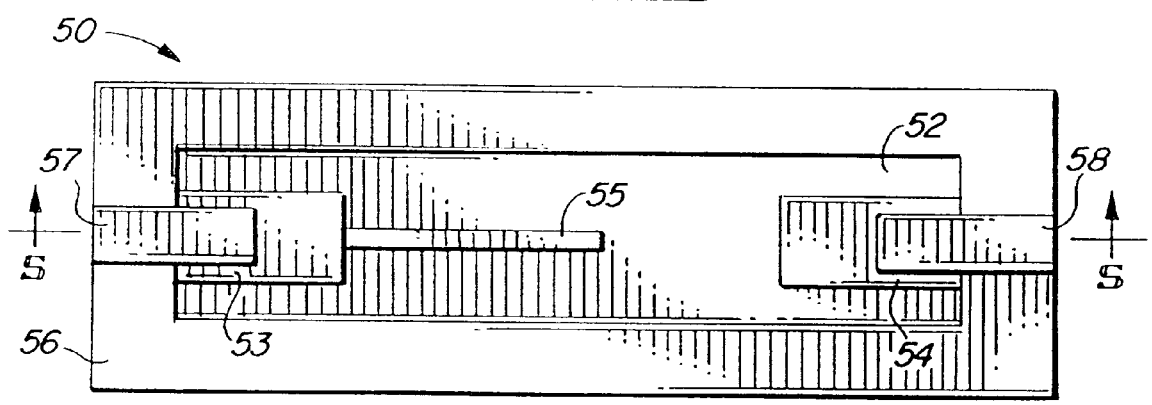
FIG. 5A is a plan view of an exemplary lateral type memory device in accordance with the present invention.
Figure 5B:
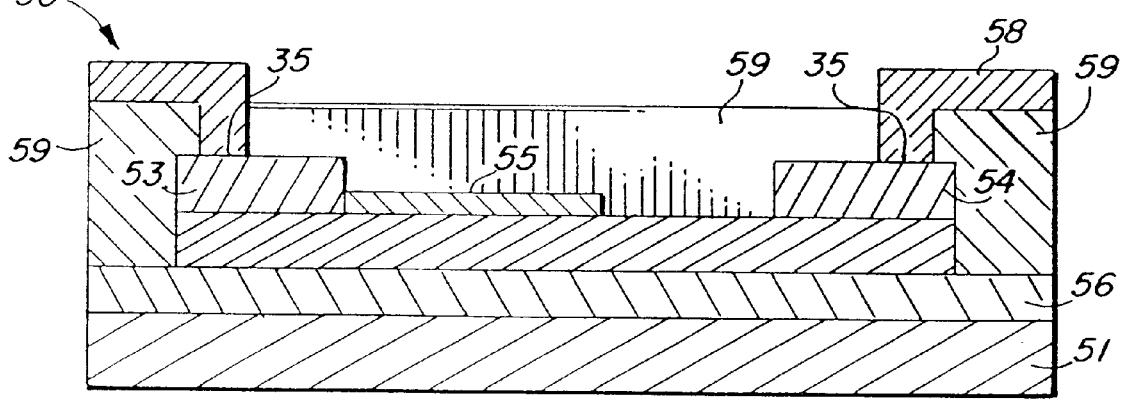
FIG. 5B is a cross-sectional view of FIG. 5A taken from line 5—5.

Turning now to FIGS. 5A and 5B, an exemplary memory cell or metal dendrite memory ("MDM") cell 50 is shown in a lateral or horizontal configuration. FIG. 5A is a plan view of MDM 50 and FIG. 5B is a cross-sectional view of MDM 50 taken from line 5—5 of FIG. 5A. In this illustrated embodiment, MDM 50 comprises a substrate 51 which provides the physical support for the memory cell or device. If substrate 51 is non-insulating or otherwise incompatible with the materials used in MDM 50, an insulator 56 may be disposed on substrate 51 to isolate the active portion of MDM 50 from substrate 51. Next, a fast ion conductor 52 is formed on substrate 51 (or insulating layer 56 if an insulator is used). Fast ion conductor 52 is appropriately patterned to provide isolation from memory cells or devices which may be adjacent to cell 50. The dimensions (e.g. length, width and thickness) of fast ion conductor 52 will determine, in part, the electrical characteristics of MDM 50. For example, if fast ion conductor 52 is thin and has a length greater than its width, the resistance value of MDM 50 will be greater than the resistance value if fast ion conductor 52 was thick and its width was greater than its length.

With continued reference to FIGS. 5A and 5B, the electrode materials are then deposited on conductor 52 and appropriately patterned to form electrode 53 (e.g., a cathode) and electrode 54 (e.g., an anode). When a voltage is applied to cathode 53 and anode 54, a dendrite 55 grows from cathode 53 along the surface of fast ion conductor 52 towards electrode 54. The dimension and shape of electrodes 53 and 54 will have an effect on the electrical characteristics of device 50. For example, if electrode 53 is narrow or comes to a point, the electric field around electrode 53 will be high and growth of dendrite 55 will be rapid. On the other hand, if electrode 53 has a broad configuration, the electric field at electrode 53 will be relatively small and the growth rate of dendrite 55 from electrode 53 will be slower.

With continued reference to FIGS. 5A and 5B, an insulating layer 59 is next deposited on device 50. This insulating layer 59 protects the active area of MDM 50 from mechanical damage or chemical contamination. Holes 35 are then appropriately provided in insulating layer 59 so as to allow a contact 57 and a contact 58 to be electrically coupled with electrode 53 and electrode 54, respectively.

With continued reference to FIGS. 5A and 5B, a person of skill in the art will recognize that this is not the only possible configuration or method for constructing a lateral MDM device. For example, an alternate configuration for MDM 50 may comprise forming electrodes 53 and 54 on substrate 51 and forming fast ion conductor 52 over these electrodes. In this configuration, dendrite 55 will grow along the interface between substrate 51 and fast ion conductor 52.

Figure 5C:
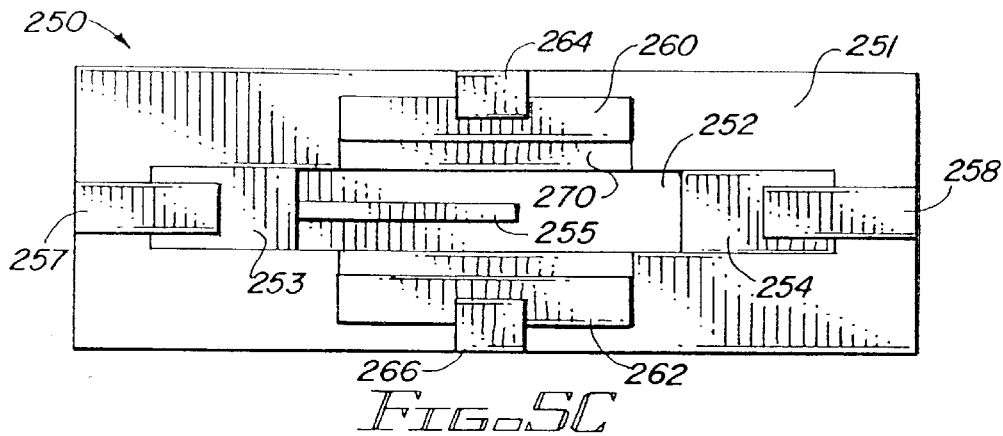
FIG. 5C is a cross-sectional view of a lateral memory device in accordance with another embodiment of the present invention.

Turning now to a consideration of FIG. 5C, the device shown there is similar to the memory cell or metal dendrite memory cell of FIGS. 5A and 5B, but in which additional electrodes are provided. Specifically, and referring now to FIG. 5C, MDM cell 250 comprises an insulator/substrate portion 251 supporting a fast ion conductor 252. As was the case with the construction referenced in FIGS. 5A and 5B, fast ion conductor 252 is appropriately patterned to provide isolation from multiple adjacent cells or devices Electrode materials are then deposited and patterned to form electrode 253 functioning as a cathode and electrode 254 functioning as an anode. When a voltage is applied to cathode 253 and anode 254, a dendrite 255 grows along the surface of fast ion conductor 252 towards electrode 254 as shown in FIG. 5C As was the case with the arrangement of FIGS. 5A and 5B, contacts 257 and 258 are provided contacting the cathode 253 and anode 254, respectively. Additionally, and as shown in FIG. 5C, two additional electrodes 260 and 262 are provided, with respective contacts 264 and 266. Actually, in accordance with this aspect of the invention either one or the other or both of the electrodes 260 and 262 may be provided, although the presence of both is shown in FIG. 5C.

The additional electrodes 260 and/or 262 in accordance with this embodiment are provided in the same plane as the dendrite 255, and are separated by a material 270 shown in FIG. 5C, which can be either a dielectric material or a resistive material. In the case of a dielectric material, the device shown in FIG. 5C will exhibit programmable capacitances between electrode 253 and electrode 260, between electrode 253 and electrode 262, and between electrodes 260 and 262, as well as of course between electrodes 253 and 254. The programmable capacitances between the various electrodes are programmed by the extent of growth of dendrite 255.

In the case of a situation where the material 270 is a resistive material, the device will exhibit corresponding programmable resistances in accordance with the extent of dendrite growth. Specifically, programmable resistances exist between electrodes 253 and 260, between electrodes 253 and 262, between electrodes 260 and 262, and of course between electrodes 253 and 254. The magnitude of all resistances will depend on the length of the dendrite grown between electrodes 253 and 254.

The device shown in FIG. 5C can offer several advantages over the device of FIGS. 5A and 5B which only has two electrodes. Specifically, a dc bias voltage can be applied between any combination of the electrodes other than electrodes 253 and 254 without altering the dendrite length and hence the capacitance and/or resistance of the device. This has important implications for the use of the device in memory arrays and other electronic circuit applications. These same considerations and advantages apply to a three electrode, rather than four electrode, device. Dendrite growth is restricted to occur between electrodes 253 and 254 and never between any of the other electrodes. Electrodes 253 and 254 are therefore the programming terminals of the device, with the other electrodes being the output terminals of the device.

Figure 5D:
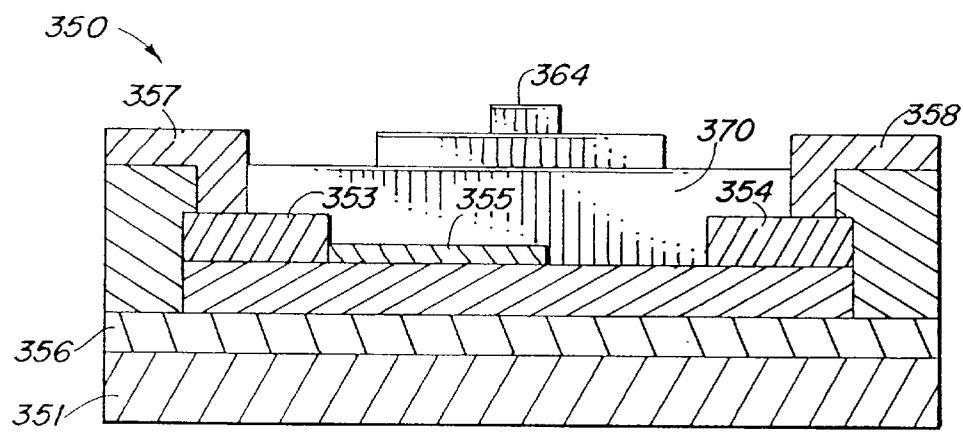
FIG. 5D is a cross-sectional view of a lateral memory device in accordance with yet another embodiment of the present invention.

Turning now to a consideration of FIG. 5D, a device is shown in cross section similar to the device of FIG. 5C, but in which the additional electrode or electrodes is or are provided above the plane of the dendrite, rather than in the same plane. As shown in FIG. 5D, MDM cell 350 comprises an insulator/substrate portion 351 supporting a fast ion conductor 352. As was the case with the construction referenced in FIGS. 5A, 5B, and 5C, fast ion conductor 352 is appropriately patterned to provide isolation from multiple adjacent cells or devices. Electrode materials are then deposited and patterned to form electrode 353 functioning as a cathode and electrode 354 functioning as an anode. When a voltage is applied to cathode 353 and anode 354, a dendrite 355 grows along the surface of fast ion conductor 352 towards electrode 354. Contacts 357 and 358 are provided contacting the cathode 353 and anode 354, respectively. Additionally, either one or two additional electrodes can be provided, with one of these electrodes 360 being shown in FIG. 5D as situated above the plane of dendrite 355, and having contact 364. The additional electrode or electrodes 360 in accordance with this embodiment are separated by a material 370 shown in FIG. 5D, which can be either a dielectric material or a resistive material. In the case of a dielectric material, the device shown in FIG. 5D will exhibit programmable capacitances between electrode 353 and electrode 360, between electrode 360 shown and another electrode 362 beneath the fast ion conductor (not shown) if provided, between electrode 360 and electrode 354, and of course between electrodes 353 and 354. The programmable capacitances between the various electrodes are programmed by the extent of growth of dendrite 355.

In the case of a situation where the material 370 is a resistive material, the device will exhibit corresponding programmable resistances in accordance with the extent of dendrite growth. Specifically, programmable resistances exist between electrodes 353 and 360, between electrodes 353 and 362 (if provided), between electrodes 360 and 362 (if provided), and of course between electrodes 353 and 354. The magnitude of all resistances will depend on the length of the dendrite grown between electrodes 353 and 354.

The device shown in FIG. 5D, like that of FIG. 5C, can offer several advantages over the device of FIGS. 5A and 5B which only has two electrodes. Specifically, a dc bias voltage can be applied between any combination of the electrodes other than electrodes 353 and 354 without altering the dendrite length and hence the capacitance and/or resistance of the device. This has important implications for the use of the device in memory arrays and other electronic circuit applications. These same considerations and advantages apply to a three electrode, as well as a four electrode, device. Dendrite growth is restricted to occur between electrodes 353 and 354 and never between any of the other electrodes. Electrodes 353 and 354 are therefore the programming terminals of the device, with the other electrodes being the output terminals of the device.

Figure 5E:
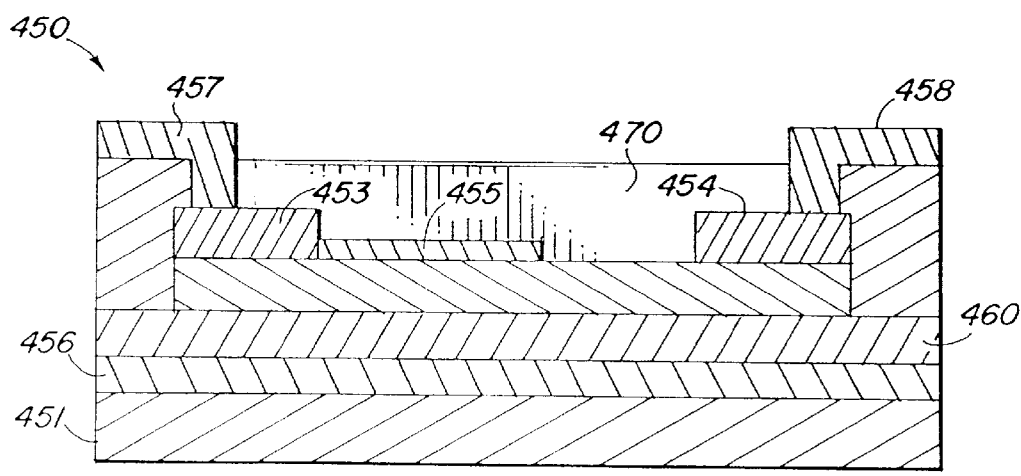
FIG. 5E is a cross-sectional view of a lateral memory device in accordance with still yet another embodiment of the present invention.

Referring now to FIG. 5E, a device is shown similar to the device of FIG. 5D, but in which the additional electrode or electrodes is or are provided in a plane beneath the plane of the dendrite. In FIG. 5E MDM cell 450 comprises an insulator/substrate portion 451 supporting a fast ion conductor 452. As was the case in the previous embodiments, fast ion conductor 452 is appropriately patterned to provide isolation from multiple adjacent cells or devices. Electrode materials are then deposited and patterned to form electrode 453 functioning as a cathode and electrode 454 functioning as an anode. When a voltage is applied to cathode 453 and anode 454, a dendrite 455 grows along the surface of fast ion conductor 452 towards electrode 454. Contacts 457 and 458 are provided contacting the cathode 453 and anode 454, respectively. Additionally, either one or two additional electrodes can be provided, with one of these electrodes 460 being shown in FIG. 5E as situated below the plane of dendrite 455. Electrical contact to electrode 460 is not specifically shown in FIG. 5E, but can be appropriately made as known to those skilled in this art through an insulated or isolated via hole through substrate 451 and insulator 456, or through an appropriate insulated or isolated via hole extending into the electrode 460 from the opposite direction, i.e., though portion 470, which can be either a dielectric material or a resistive material. In the case of a dielectric material, the device shown in FIG. 5E will exhibit programmable capacitances between electrode 453 and electrode 460, between electrode 460 shown and another electrode 462 above the fast ion conductor (not shown and if provided), between electrode 460 and electrode 454, and of course between electrodes 453 and 454. The programmable capacitances between the various electrodes are programmed by the extent of growth of dendrite 455.

In the case of a situation where the material 470 is a resistive material, the device will exhibit corresponding programmable resistances in accordance with the extent of dendrite growth. Specifically, programmable resistances exist between electrodes 453 and 460, between electrodes 453 and 462 (if provided), between electrodes 460 and 462 (if provided), and of course between electrodes 453 and 454. The magnitude of all resistances will depend on the length of the dendrite grown between electrodes 453 and 454.

The device shown in FIG. 5E, like that of FIGS. 5C and 5D, can offer several advantages over the device of FIGS. 5A and 5B which only has two electrodes. Specifically, a dc bias voltage can be applied between any combination of the electrodes other than electrodes 453 and 454 without altering the dendrite length and hence the capacitance and/or resistance of the device. This has important implications for the use of the device in memory arrays and other electronic circuit applications. These same considerations and advantages apply to a three electrode, as well as a four electrode, device. Dendrite growth is restricted to occur between electrodes 453 and 454 and never between any of the other electrodes. Electrodes 453 and 454 are therefore the programming terminals of the device, with the other electrodes being the output terminals of the device.

Figure 6A:
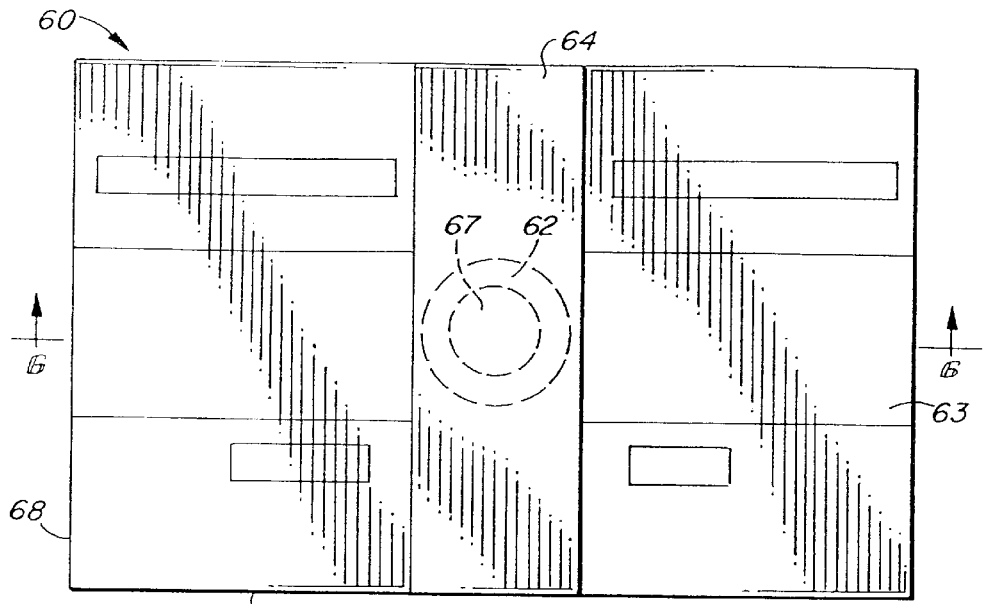
FIG. 6A is a plan view of an exemplary vertical-type memory device in accordance with the present invention.
Figure 6B:
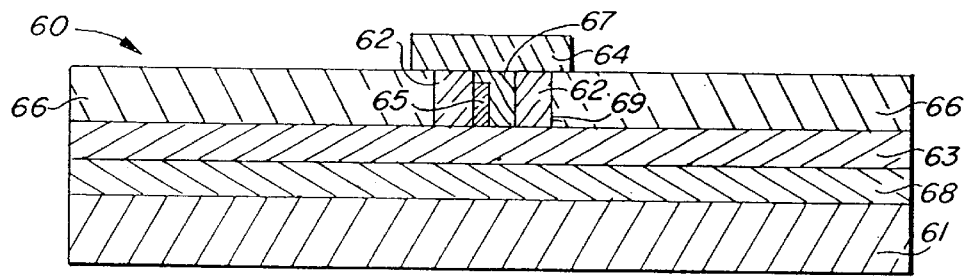
FIG. 6B is a cross-sectional view of FIG. 6A taken from line 6—6.

Turning now to FIGS. 6A and 6B, an exemplary embodiment of a vertically-configured MDM 60 is shown. FIG. 6A is a plan view of MDM 60 and FIG. 6B is a cross-sectional view of FIG. 6A taken from line 6—6.

With continued reference to FIGS. 6A and 6B, MDM 60 comprises a substrate 61 which provides physical support for the memory cell or device and, if appropriate, an insulator 68 to insulate substrate 61 from the active portion of MDM 60.

With continued reference to FIGS. 6A and 6B, an electrode 63 is formed over insulator 68. Next, an insulating layer 66 is deposited and patterned over a portion of electrode 63 to form a via hole 69 using processing techniques known in the art. Via hole 69 serves as the housing for the active area of MDM 60. Next, a fast ion conductor 62 is deposited within via hole 69 using conventional techniques so as to extend from the top of hole 69 down to electrode 63 where it is electrically coupled. Thereafter, a via fill 67 such as a pliant insulating material that will not hinder dendrite growth is used to fill the unfilled portions of via hole 69 to protect the hole and prevent overlying layers or materials from filling hole 69.

With continued reference to FIGS. 6A and 6B, an electrode 64 is next formed so that at least a portion of electrode 64 makes electrical contact with fast ion conductor 62. Electrode 64 is preferably formed on a plane parallel to the plane formed by electrode 63 and at a right angle. Electrode 64 is prevented by insulator 66 from making direct electrical contact with electrode 63. When a voltage is applied to electrodes 63 and 64, a dendrite 65 grows vertically at the surface of fast ion conductor 62 and along the inside of via hole 69, dendrite 65 extending from the cathode (e.g. electrode 63) towards the anode (e.g. electrode 64).

With continued reference to FIGS. 6A and 6B, the vertical configuration of MDM 60 is considerably more compact than the horizontally-configured MDM of FIGS. 5A and 5B and thus may be considered the "high density" configuration, as many more MDM elements may be fabricated per unit area. For example, in the vertical version, multiple alternating anode and cathode layers with intervening fast ion conductors may be stacked to dramatically increase storage capacity. Storage densities in excess of 25 Mb/cm$^2$ are possible with a single vertical structure and these densities will double with an anode-cathode-anode arrangement. In such an arrangement, the maximum storage density may be limited by the size and complexity of the column and row decoder circuitry. However, if the MDM storage stack is fabricated on an integrated circuit, the whole semiconductor chip area can be dedicated to row/column decode, sense amplifiers, and data management circuitry since the MDM elements will not use any silicon real estate. This should allow storage densities of many Gb/cm$^2$ to be attained. Used in this manner, the MDM is essentially an additive technology that adds capability and functionality to existing silicon integrated circuit technology.

The exemplary MDMs of FIGS. 5 and 6 represent a significant departure from conventional silicon-based microelectronics. Silicon is not required for the operation of the MDM unless control electronics are to be incorporated on to the same chip. Also, the overall manufacturing process of an MDM is considerably simpler than even the most basic semiconductor processing techniques. With simple processing techniques coupled with reasonable material costs, the MDM provides a memory device with a much lower production cost than other memory devices.

1. PROM and Anti-fuse Applications

With continued reference to FIGS. 5 and 6, MDM 50 and 60 can be utilized as PROM type memory devices. Most current PROMs use fusible links which are broken or blown during programming. Once a link is broken, it cannot be remade. The MDMs of the present invention provide the ability to make, rather than break, a connection. This is more desirable as it gives more latitude and flexibility; for example, even if a wrong link (i.e. dendrite) is made, this link can always be blown like a conventional fuse. Also, the dendrites of the MDMs can withstand many make/break cycles; thus, multiple reprogramming cycles are possible.

The MDMs of the present invention may also be used in programmable logic arrays ("PLAs"). In PLAs, blocks of logic elements such as gates or adders are formed but are not connected. The connections are made to suit a particular low volume application (e.g. an application which would not justify a custom chip design). Traditionally, the final connections between the various logic elements are made at the production facility. However, the MDMs of the present invention would allow such PLA devices to be "field programmable" as it is relatively easy to electrically define hard connections between sections on the chip with the metal dendrites.

Anti-fuses are also found in integrated circuits where redundancy techniques are used to combat process-induced defects and in-service failures. For example, complex, high-density circuits such as 64 Mbyte DRAM, have more memory on board the chip then is actually used. If one section of the chip is damaged during processing or fails during operation, spare memory may be brought on line to compensate. Typically, this process is controlled by logic gates on the memory chip and requires constant self-testing and electrical reconfiguration. An MDM in accordance with the present invention may be incorporated into such memory chips to appropriately form new connections inside the chip when required.

In accordance with the present invention, data may be written to PROM configured MDMs ("MDM-PROMs") by applying a constant or pulsed bias to the electrodes of the MDM to promote dendrite growth. The metal dendrite is allowed to reach the anode so as to form a low resistance anti-fuse connection. This connection changes both the resistance and the capacitance of the memory system. The MDM-PROM memory cell may then be easily "read" by passing a small current (i.e. a current small enough not to damage the dendrite) through the dendrite connection. "Erasing" the MDM-PROM is accomplished by passing a large current through the dendrite so as to destroy the dendrite and break the connection. If enough metal ion material still remains between the opposing electrodes of the MDM, a new dendrite may be grown later as appropriate.

In the MDM-PROM, the electrical change between the two dendrite connected electrodes is so great that transistors are not required at the MDM cells. This is true regardless of whether a lateral or vertical configured MDM is employed. In the vertical or high-density configuration, the memory element size becomes a function of anode/fast ion conductor/cathode geometry alone. This geometry allows the memory of the present invention to be the most compact electrical storage means available, much more compact than floating gate or ferroelectric memories which require transistors to be part of their storage elements. In addition, both lateral and vertical MDM configurations may be formed on virtually any chemically and mechanically stable substrate material; if silicon is required for additional circuitry, the MDM may simply be formed on a silicon substrate.

2. EEPROM Applications

With continued reference to FIGS. 5 and 6, the ability to create and control a non-volatile change in an electrical parameter such as resistance or capacitance allows the MDM of the present invention to be used in many applications which would otherwise utilize traditional EEPROM or FLASH technologies. Advantages provided by the present invention over present EEPROM and FLASH memory include, among others, lower production cost and the ability to use flexible fabrication techniques which are easily adaptable to a variety of applications. MDMs are especially advantageous in applications where cost is the primary concern, such as smart cards and electronic inventory tags. Also, the ability to form the memory directly on a plastic card is a major advantage in these applications as this is impossible with all other semiconductor memories.

Further, in accordance with the MDM device of the present invention, memory elements may be scaled to less than a few square microns in size, the active portion of the device being less than one micron. This provides a significant advantage over traditional semiconductor technologies in which each device and its associated interconnect can take up several tens of square microns.

In accordance with another embodiment of the present invention, pass transistors are used in the EEPROM configured MDMs ("MDM-EEPROMs") for providing EEPROM devices with DRAM-type densities. Alternatively, the materials of the MDM devices or separate diodes or thin film transistors ("TFTs") may be used in place of the silicon pass transistors to prevent cell-to-cell short circuits in an array having a plurality of devices.

In accordance with the present invention, data may be written to MDM-EEPROMs by applying a constant or pulsed bias to the electrodes of the MDM to promote dendrite growth. The growth of the dendrite changes both the resistance and capacitance of the device, both of which are easily measured. In the MDM-EEPROM, an insulating barrier, such as an oxide wall, may be disposed adjacent to the anode to prevent the dendrite from reaching and electrically coupling with the anode when a voltage is applied. The MDM-EEPROM cell may then be easily "read" by applying a small AC signal to the MDM device (i.e. alternating the anode and cathode). This AC signal, which "wiggles" the dendrite back and forth but does not fully grow or retract the dendrite, results in a dynamic capacitance and resistance change around the low or high states. "Rewriting" or "erasing" the MDM-EEPROM merely involves the application of a bias voltage which is opposite to the direction of the dendrite growth (i.e. reversal of the anode and cathode). In a preferred embodiment where one electrode comprises aluminum and the other electrode comprises silver, the dendrite will only grow from and retract toward the aluminum electrode; a new dendrite does not form from the silver electrode during the retraction event.

Since the MDM elements exhibit highly non-volatile characteristics, and since the dendrite position (and hence resistance and capacitance) is a function of the magnitude and duration of the applied voltage, multiple-state or n-state logic storage is also possible. In this storage scheme, more than two levels (i.e. binary) may be held in each storage cell; thus, increasing the overall storage density greatly. For example, 4-state storage (possible by using four dendrite positions) allows a doubling of memory capacity per unit area for the same storage cell size. Thus, in accordance with the present invention, MDMs may be able to store a continuum of analog, rather than digital, quantities. The storage of analog values in conventional memory technologies is extremely difficult if not impossible.

3. Military and Aerospace Applications

The present invention has many attributes which lead to other potential fields of use. All read/write electronic memories are based on the principle of a charge storage. In DRAMs the charge is stored for a few microseconds, in EEPROMs the charge may be stored for years. Unfortunately, there are various processes which can change this charge such as ionizing radiation. For example, in military and space applications, alpha particles, when passing through a typical semiconductor device, leave a charged trail which alters the charge in the semiconductor device. In the case of memory technologies, this leads to soft errors and data corruption. The present invention, on the other hand, does not depend on charge storage but on a physical change in the materials this material being unaffected by relatively large doses of radiation. In other words, the present invention is radiation hard. This provides significant advantages for military and space systems as well as many high-integrity commercial systems such as aircraft and navigation systems.

4. Synthetic Neural Systems

Another application of the present invention is in synthetic neural systems ("SNS"). SNS devices are based on the workings of the human brain and are destined to become the next generation of computing and control devices. SNS devices rely on the ability to make connections between elements as part of a "learning" process. Connections are formed between the most active circuit nodes (i.e. those nodes which have signals present for a majority of the time). The "training" of the systems, by the application of input, results in a form of hard-wired logic. However, this type of system is extremely difficult to achieve with conventional silicon-based devices. On the other hand, in accordance with the present invention, SNS systems comprise MDMs. Because formation of a dendrite depends on the presence of a voltage signal, connections naturally form between the most active nodes as the dendrites grow toward the electrodes which have voltages applied to them. In addition, the strength of the connection, governed by its capacitance, will depend on the strength of the input. This directable analog memory effect is another significant aspect of the present invention.

III. Programmable Resistance/Capacitance Devices

Figure 7A:
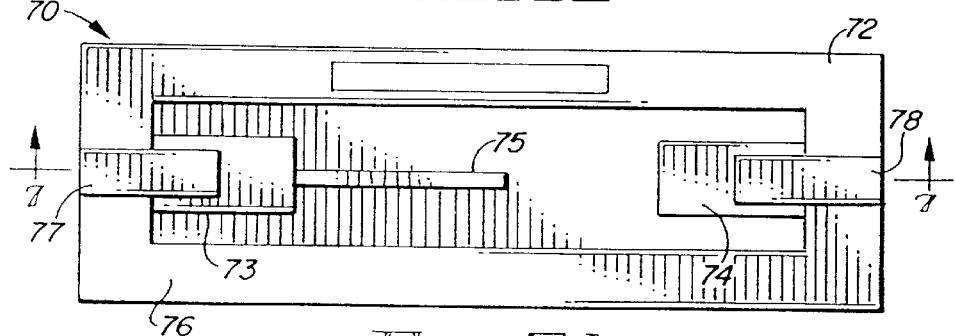
FIG. 7A is a plan view of an exemplary embodiment of a programmable resistance/capacitance device in accordance with the present invention.
Figure 7B:
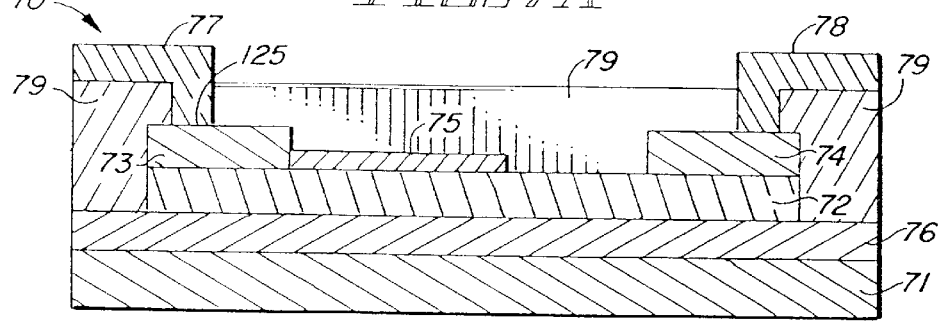
FIG. 7B is cross-sectional view of FIG. 7A taken from line 7—7.
Figure 8A:
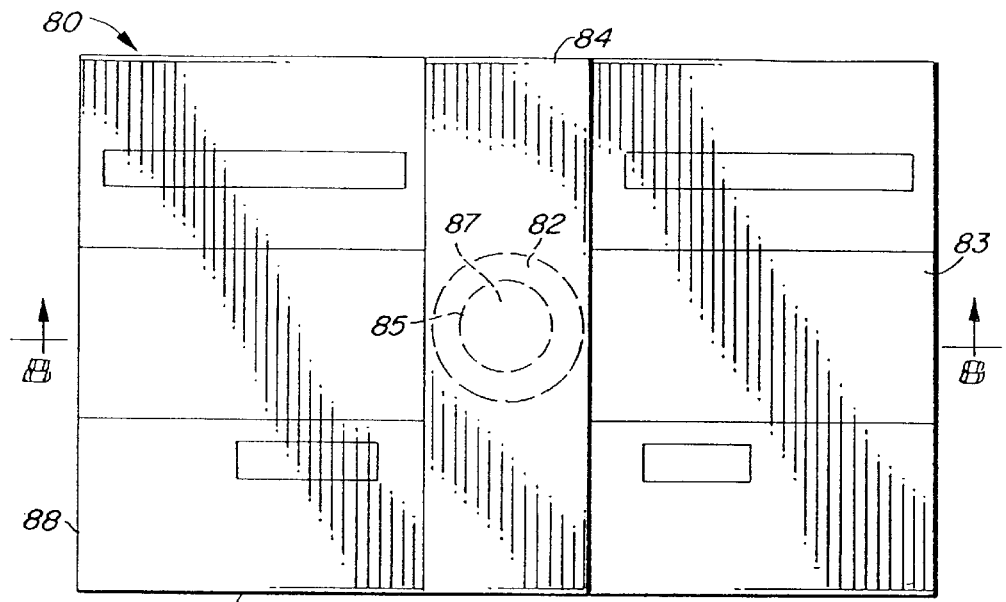
FIG. 8A is a plan view of a programmable resistance/capacitance device in accordance with another embodiment of the present invention.
Figure 8B:
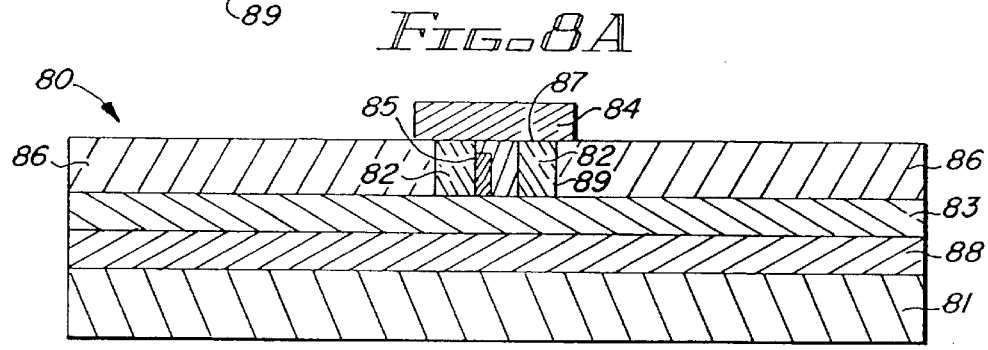
FIG. 8B is a cross-sectional view of FIG. 8A taken from line 8—8.

Referring now to FIGS. 7 and 8, an exemplary programmable resistance and capacitance ("PR/C") device is shown in accordance with the present invention. FIGS. 7A and 7B are plan and cross-sectional views, respectively, of a lateral type device. FIGS. 8A and 8B are plan and cross-sectional views, respectively, of a vertical-type PR/C device in accordance with another embodiment of the present invention.

With specific reference to FIGS. 7A and 7B, an exemplary PR/C device 70 is shown in a lateral or horizontal configuration. FIG. 7A is a plan view of PR/C 70 and FIG. 7B is a cross-sectional view of PR/C 70 taken from line 7—7 of FIG. 7A. In this illustrated embodiment, PR/C 70 comprises a substrate 71 which provides the physical support for the PR/C device. If substrate 71 is non-insulating or otherwise incompatible with the materials used in PR/C 70, an insulator 76 may be disposed on substrate 71 to isolate the active portion of PR/C 70 from substrate 71. Next, a fast ion conductor 72 is formed on substrate 71 (or formed on insulating layer 76 if insulator 76 is used). Fast ion conductor 72 is appropriately patterned to provide isolation between adjacent PR/C or other devices. The dimensions (e.g. length, width and thickness) of fast ion conductor 72 will effect the electrical characteristics of PR/C 70. For example, if fast ion conductor 72 is thin and has a length greater than its width, the resistance value of PR/C 70 will be greater than the resistance value if fast ion conductor 72 was thick and its width was greater than its length.

With continued reference to FIGS. 7A and 7B, electrode materials are then deposited on fast ion conductor 72 and appropriately patterned to form electrode 73 (e.g., a cathode) and electrode 74 (e.g., an anode). When a voltage is applied to cathode 73 and anode 74, a dendrite 75 grows from cathode 73 along the surface of fast ion conductor 72 towards electrode 74. The dimension and shape of electrodes 73 and 74 contribute to the characteristics of device 70. For example, if electrode 73 is narrow or comes to a point, the electric field will be high and growth of dendrite 75 from electrode 73 will be rapid. On the other hand, if electrode 73 has a broad configuration, the electric field at electrode 73 is relatively small and the growth of dendrite 55 from electrode 73 will be slower.

With continued reference to FIGS. 7A and 7B, an insulating layer 79 is next deposited on device 70. Insulating layer 79 protects the active area of PR/C 70 from mechanical damage or chemical contamination. Holes 125 are then appropriately provided in insulating layer 79 so as to allow a contact 77 and a contact 78 to be electrically coupled with electrode 73 and electrode 74, respectively.

With continued reference to FIGS. 7A and 7B, a person of skill in the art will recognize this is not the only possible configuration or method for constructing a lateral PR/C device. For example, an alternate configuration for PR/C 70 comprises forming electrodes 73 and 74 on substrate 71 and then forming fast ion conductor 72 on top of these electrodes. In this case, dendrite 75 will grow along the interface between substrate 71 and fast ion conductor 72.

As discussed earlier in connection with FIGS. 5C, 5D, and 5E, and focusing on metal dendrite memory (MDM) devices, devices in accordance with some embodiments of the invention include an electrode or electrodes additional to the two electrodes utilized to program dendrite growth, which can be used for "outputs" of the devices. These are illustrated in FIGS. 5C, 5D and 5E, and the same structures are applicable for providing programmable capacitance and resistant elements in contexts other than memory elements and for appropriate application anywhere capacitance and resistance elements are utilized.

Turning now to FIGS. 8A and 8B, an exemplary embodiment of a verticallyconfigured PR/C 80 is shown. FIG. 8A is a plan view of PR/C 80 and FIG. 8B is a cross-sectional view of PR/C 80 taken from line 8—8 of FIG. 8A.

With continued reference to FIGS. 8A and 8B, PR/C 80 comprises a substrate 81 which provides the mechanical support for the programmable cell or device and, if appropriate, an insulator 88 to insulate substrate 81 from the active portion of PR/C 80. An electrode 83 is then formed over insulator 88. Next, an insulating layer 86 is deposited and patterned over a portion of electrode 83 to form a via hole 89 using processing techniques known in the art. Via hole 89 is used for housing the active area of PR/C 80. Next, a fast ion conductor 82 is deposited within via hole 89 using conventional techniques so as to extend from the top of hole 89 down to electrode 83 where it is electrically coupled. Thereafter, a via fill 87 such as a pliant insulating material that will not hinder dendrite growth is used to fill the unfilled portions of via hole 89 to protect hole 89 and prevent the electrode to be formed above from filling hole 89.

With continued reference to FIGS. 8A and 8B, an overlying electrode 84 is next formed so that at least a portion of electrode 84 makes electrical contact with fast ion conductor 82. Electrode 84 is preferably formed on a plane parallel to the plane formed by electrode 83 and at a right angle. Electrode 84 is prevented by insulator 86 from making electrical contact with electrode 63. When a voltage is applied to electrodes 83 and 84, a dendrite 85 grows vertically at the surface of fast ion conductor 82 and along the inside of via hole 89, dendrite 85 extending from the cathode (e.g. electrode 83) towards the anode (e.g. electrode 84).

With continued reference to FIGS. 8A and 8B, the vertical configuration of PR/C 80 is considerably more compact than the horizontal configuration of FIGS. 8A and 8B and thus may be considered the "high density" configuration, as many more PR/C elements may be fabricated per unit area. For example, in the vertical version, multiple alternating anode and cathode layers with intervening fast ion conductors may be stacked to dramatically increase the number of elements per unit area.

With reference now to FIGS. 7 and 8, the PR/C devices of the present invention are typically constructed so as to be physically larger than the MDM devices of FIGS. 5 and 6 so that a greater parametric variability may be attainable. The PR/C devices of the present invention are "programmed" using a DC voltage; consequently, a small signal AC voltage would not affect the dendrite condition and hence the resistance or capacitance would not vary. These programmable devices may be used as tuned circuits in general (e.g., frequency selection in communication systems, tone controls and audio systems, voltage controlled filter circuits), voltage controlled oscillators ("VCOs"), signal level (e.g., volume controls), automatic gain controls ("AGC"), and the like.

With continued reference to FIGS. 7 and 8, the exemplary PR/Cs represent a significant departure from conventional silicon-based microelectronics. In fact, silicon is not even required for the operation of the PR/C. Also, the overall manufacturing process is considerably simpler than even the most basic semiconductor processing techniques. The simple processing techniques coupled with reasonable material costs provide a device with a low production cost.

IV. Electro Optical Devices

In accordance with the present invention, PMC devices may also be incorporated in electro-optic applications by utilizing broad dendrite growth between wide electrodes at high applied voltage.

Figure 9A:
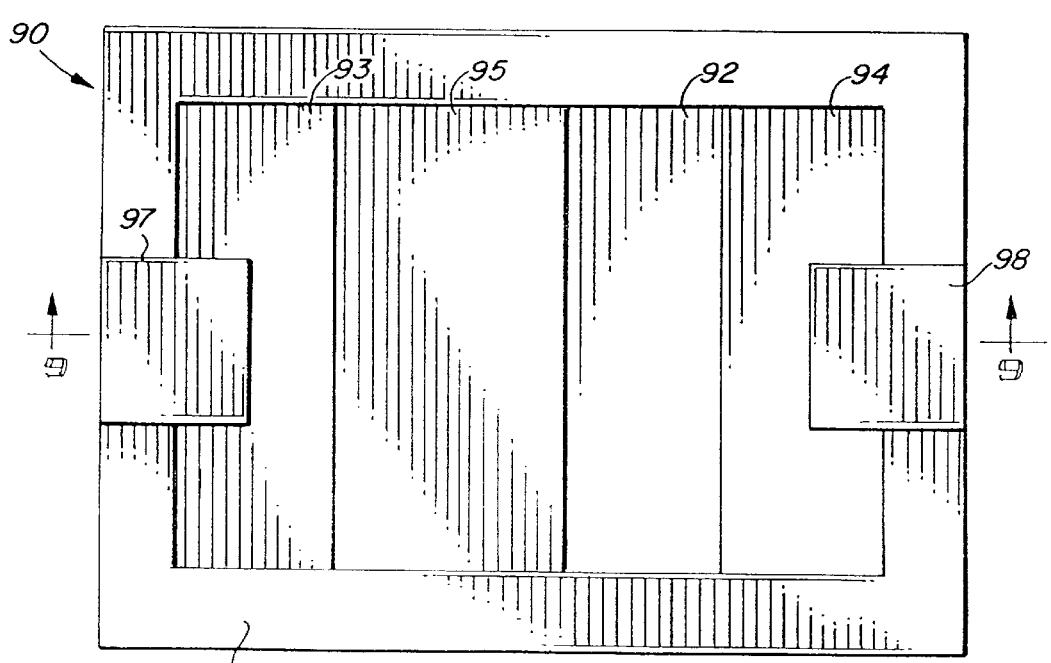
FIG. 9A is a plan view of an exemplary electro-optical device in accordance with the present invention.
Figure 9B:
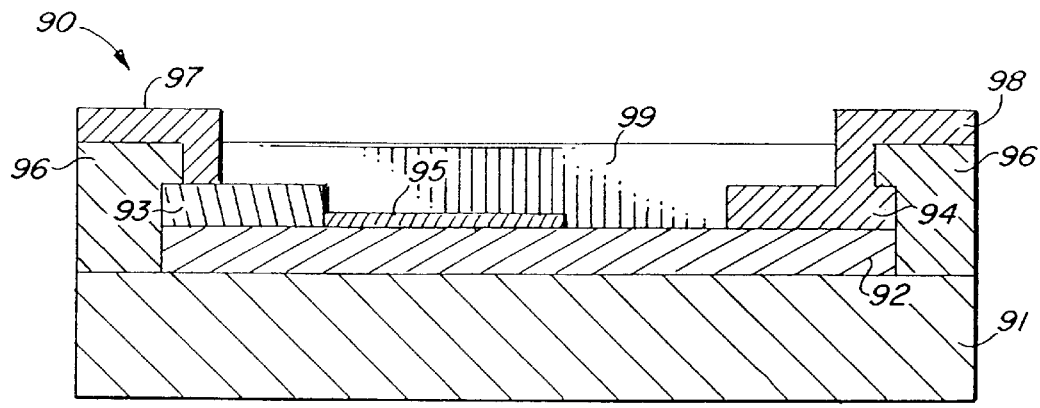
FIG. 9B is a cross-sectional view of the electro-optical device of FIG. 9A taken from line 9—9.

With reference now to FIGS. 9A and 9B, an exemplary optic device 90 is shown where FIG. 9A is a plan view of optic device 90 and FIG. 9B is a cross-sectional view of optic device 90 taken from line 9—9 of FIG. 9A. In this exemplary embodiment, device 90 comprises a substrate 91 which provides the mechanical support for the optic device. Next, a fast ion conductor 92 is formed on substrate 91, fast ion conductor 92 being appropriately patterned to provide isolation between adjacent cells or other devices.

With continued reference to FIGS. 9A and 9B, electrode materials are then deposited on fast ion conductor 92 and appropriately patterned to form electrode 93 (e.g., a cathode) and electrode 94 (e.g., an anode). The configuration of electrodes 93 and 94 are much broader in width than the electrodes of the horizontal MDM of FIGS. 5A and 5B. When a large voltage (i.e., voltage greater than 5 volts) is applied to electrodes 93 and 94, a "sheet" of metal dendrite 95 is produced, dendrite 95 growing from cathode 93 along the surface of fast ion conductor 92 towards electrode 94. Dendrite sheet 95 may be used as a shutter to block the passage of light through an optical cell or as a mirror to reflect light incident on the back or front surface of optic device 90.

With continued reference to FIGS. 9A and 9B, a transparent window 99 is formed over dendrite 95. A contact 97 and a contact 98 are then electrically coupled with electrode 93 and electrode 94, respectively.

With continued reference to FIGS. 9A and 9B, a person of skill in the art will recognize there are other possible configurations or methods for constructing an electro-optic device in accordance with the present invention.

V. Light and Short Wavelength Radiation Sensors

Figure 10A:
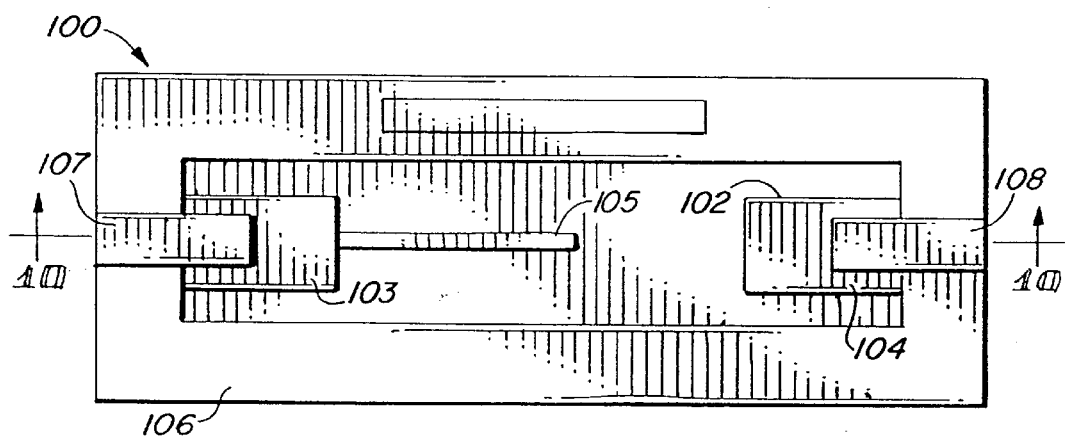
FIG. 10A is a plan view of an exemplary radiation sensor in accordance with the present invention.
Figure 10B:
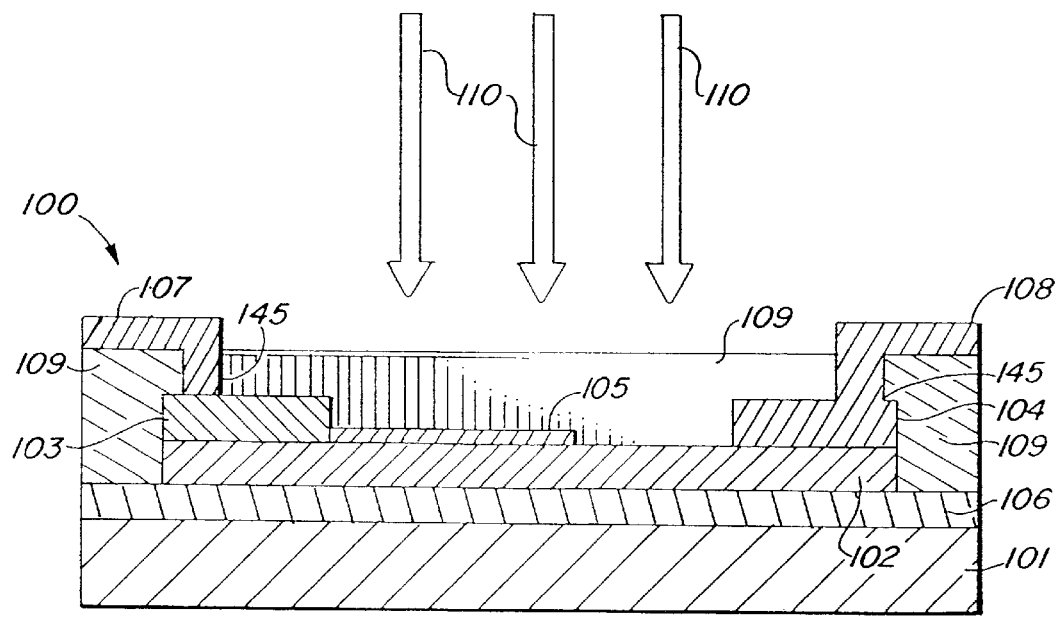
FIG. 10B is a cross-sectional view of the sensor of FIG. 10A taken from line 10—10.

With reference now to FIGS. 10A and 10B, an exemplary light and short wavelength radiation sensor 100 is described where FIG. 10A represents a plan view of sensor 100 and FIG. 10B illustrates a cross-section of sensor 100 taken from line 10—10 of FIG. 10A.

With continued reference to FIGS. 10A and 10B, sensor 100 comprises a substrate 101 which provides the support for the sensor device. If substrate 101 is non-insulating or otherwise incompatible with the materials used in sensor 100, an insulator 106 may be deposited on substrate 101 to isolate the active portion of sensor 100 from substrate 101. Next, a fast ion conductor 102 is formed on substrate 101 (or formed on insulating layer 106 if an insulator is used). The dimensions (e.g. length, width and thickness) of fast ion conductor 102 will determine, in part, the electrical characteristics of sensor 100. For example, if fast ion conductor 102 is thin and has a length greater than its width, the resistance value of sensor 102 will be greater than the resistance value if fast ion conductor 102 was thick and its width was greater than its length.

With continued reference to FIGS. 10A and 10B, electrode materials are then deposited on fast ion conductor 102 and appropriately patterned to form electrode 103 (e.g., a cathode) and electrode 104 (e.g., an anode). When a voltage is applied to cathode 103 and anode 104, a dendrite 105 grows from cathode 103 along the surface of fast ion conductor 102 towards electrode 104. The dimension and shape of electrodes 103 and 104 contribute to the characteristics of sensor 100. For example, if electrode 103 is narrow or comes to a point, the electric field will be high and growth of dendrite 105 from electrode 103 will be rapid. On the other hand, if electrode 103 has a broad configuration, the electric field at electrode 103 is relatively small and the growth of dendrite 105 from electrode 103 will be slower.

With continued reference to FIGS. 10A and 10B, a transparent window 109 is next formed over electrodes 103 and 104 and over the region reserved for dendrite 105. Holes 145 are then appropriately provided in window 109 so as to allow a contact 107 and a contact 108 to be electrically coupled with electrode 103 and electrode 104, respectively.

With continued reference to FIGS. 10A and 10B, a short wavelength radiation 110 enters sensor 100 through window 109. The growth and dissolution rate of dendrite 105 is sensitive to visible light in the orange to violet range as well as to shorter wavelengths, particularly ultraviolet; the growth rate of dendrite 105 is much less sensitive to wavelengths below ultraviolet. Light of short wavelength 110 which is incident on transparent window 109 enhances the ionization of the metal during growth or dissolution of dendrite 105 and hence the time to grow or dissolve dendrite 105 is reduced. This time difference may be detected by electronic means and then related to the intensity of the incident radiation.

With continued reference to FIGS. 10A and 10B, a person of skill in the art will recognize this is not the only possible configuration or method for constructing a sensor device. For example, an alternate configuration for sensor 100 comprises forming electrodes 103 and 104 on substrate 101 and then forming fast ion conductor 102 on top of these electrodes. In this case, dendrite 105 will grow along the interface between substrate 101 and fast ion conductor 102.

V. Conclusion

Thus, in accordance with the present invention, a low cost, highly manufacturable device is obtained that may be employed in a variety of applications such as memory devices, programmable resistor and capacitor devices, optical devices, sensors, and the like.

Although the present invention is set forth herein in the context of the appended drawing figures, it should be appreciated that the invention is not limited to the specific forms shown. Various other modifications, variations, and enhancements in the design, arrangement, and implementation of, for example, the PMC, as set forth herein may be made without departing from the spirit and scope of the present invention as set forth in the appended claims. Furthermore, one of skill in the art will appreciate that various other applications and uses exist for the PMC device besides the specific examples given.

What is claimed is:

1. A programmable metallization cell optical device comprising a body formed of a fast ion conductor material having metallic ions disposed therein, wherein said fast ion conductor has at least one portion transparent to light of some wavelength; a plurality of conducting electrodes deposited on said body of material, said electrodes adapted to have a first voltage applied between two of said electrodes to program the cell by growing a metallic dendrite from the negative of the two electrodes toward the positive of the two electrodes while the first voltage is applied thereto.

2. A programmable metallization cell optical device in accordance with claim 1, wherein said two electrodes are adapted to have a second voltage, opposite in polarity to said first voltage, applied thereto to reverse growth of the metallic dendrite while the second voltage is applied thereto.

3. A programmable metallization cell optical device in accordance with claim 2, wherein programming of said metallic dendrite will selectively block and unblock light transmission through said fast ion conductor.

4. A programmable metallization cell optical device in accordance with claim 1, including an electrical insulating material interposed between said electrodes to inhibit metallic dendrite growth so that the metallic dendrite grown from one electrode can not grow to a point where it contacts the other electrode.

5. A programmable metallization cell optical device in accordance with claim 1, wherein said fast ion conductor is formed from a metal ion-containing glass.

6. A programmable metallization cell optical device in accordance with claim 1, wherein said fast ion conductor is formed of a chalcogenide-metal ion material selected from the group consisting of sulfur, selenium and tellurium.

7. A programmable metallization cell optical device in accordance with claim 6, wherein said chalcogenide-metal ion material contains a metal selected from the group consisting of Group IB and Group IIB metals.

8. A programmable metallization cell optical device in accordance with claim 6, wherein said chalcogenide-metal ion material contains a metal selected from the group consisting of silver, copper and zinc.

9. A programmable metallization cell optical device in accordance with claim 1, wherein said fast ion conductor is formed of a chalcogenide-metal ion material containing arsenic trisulphide-silver.

10. A programmable metallization cell optical device in accordance with claim 1, wherein said fast ion conductor contains $AgAsS_2$.

11. A programmable metallization cell optical device in accordance with claim 1, wherein said length of said dendrite increases when said voltage is applied across said electrodes, and said length of said dendrite decreases when said voltage is reversed.

12. A programmable metallization cell optical device in accordance with claim 1, wherein said dendrite remains intact when said voltage is removed.

13. A method of forming a programmable metallization cell optical device comprising the steps of providing a body formed of a fast ion conductor material having metallic ions disposed therein and at least a portion thereof transparent to light of some wave length, and providing a plurality of metallic electrodes deposited on said body of material, wherein a metallic dendrite grows when a voltage is applied between at least two of said electrodes.

14. The method of claim 13 wherein said step of providing a fast ion conductor material comprises providing a chalcogenide selected from the group consisting of sulfur, selenium, and tellurium, and a metal selected from Group IB or Group IIB of the periodic chart.

15. The method of claim 14 wherein said step of providing a fast ion conductor material comprises providing an arsenic trisulphide-silver material.

16. The method of claim 15 wherein said step of providing an arsenic trisulphide-silver material comprises the step of illuminating a silver film and an arsenic sulphide layer with a light of wavelength less than 500 nanometers.

17. A method of programming a programmable metallization cell optical device having a plurality of electrodes comprising the step of applying for a predetermined time a first voltage between two of said plurality of electrodes to establish a negative electrode and a positive electrode to grow a metal dendrite from the negative electrode to the positive electrode during the predetermined time of application of the voltage.

18. A method of altering the programming of the programmable metallization cell optical device of claim 17, by application of a second voltage for a predetermined time to said two electrodes.

19. A method of altering the programming of the programmable metallization cell optical device of claim 18, by applying a second voltage of the same polarity as the first voltage to further grow the metal dendrite from the negative electrode to the positive electrode.

20. A method of altering the programming of the programmable metallization cell optical device of claim 18, by applying a second voltage of a polarity opposite to the first voltage to reverse the metallic dendrite growth.

* * * * *